(12) United States Patent
Chen et al.

(10) Patent No.: US 6,897,572 B2
(45) Date of Patent: May 24, 2005

(54) POWER RING ARCHITECTURE FOR EMBEDDED LOW DROP OFF VOLTAGE REGULATORS

(75) Inventors: Datong Chen, Fremont, CA (US); Ping Wu, Cupertino, CA (US); Qiu Sha, Sunnyvale, CA (US)

(73) Assignee: Spreadtrum Communications Corporation, Sunnyvale, CA (US)

( * ) Notice: Subject to any disclaimer, the term of this patent is extended or adjusted under 35 U.S.C. 154(b) by 281 days.

(21) Appl. No.: 10/371,216

(22) Filed: Feb. 21, 2003

(65) Prior Publication Data

US 2004/0164397 A1 Aug. 26, 2004

(51) Int. Cl.[7] .......................... H01L 23/50; H01L 21/00
(52) U.S. Cl. ........................ 257/798; 438/800
(58) Field of Search ................................. 257/666, 691, 257/798; 438/123, 800; 323/371; 327/540

(56) References Cited

U.S. PATENT DOCUMENTS

| | | | |
|---|---|---|---|
| 5,731,686 A | 3/1998 | Malhi | |
| 5,966,004 A | 10/1999 | Kadanka | |
| 6,046,577 A | 4/2000 | Rincon-Mora et al. | |
| 6,331,977 B1 | 12/2001 | Spaderna et al. | |
| 6,347,357 B1 | 2/2002 | Sartore et al. | |
| 6,355,502 B1 | 3/2002 | Kang et al. | |
| 6,366,506 B1 | 4/2002 | Mizuno et al. | |

*Primary Examiner*—David A. Zarneke
(74) *Attorney, Agent, or Firm*—Perkins Coie LLP

(57) ABSTRACT

An integrated circuit including a power ring and an embedded low drop-off voltage regulator is disclosed herein. The regulator is located within an inner side of the power ring. An input of the regulator is coupled to the power ring. An output of the regulator is coupled to a circuit also included in the integrated circuit. The regulator is configured to fit within a bond pad frame.

18 Claims, 2 Drawing Sheets

POWER RING ARCHITECTURE FOR EMBEDDED LOW DROP OFF VOLTAGE REGULATORS

BACKGROUND

The present invention relates to integrated circuits. More particularly, the present invention relates to a power ring architecture for integrated circuits.

An integrated circuit (IC), and, in particular, a system on chip (SoC), may be powered by a plurality of power supplies, each power supply providing power to a different section or component of the IC. As shown in FIG. 1, a semiconductor chip 10 includes a first bond pad 12, a second bond pad 14, and a third bond pad 16. Each of bond pads 12, 14, and 16 represents a power supply point for its respective circuitry (not shown) on chip 10. Chip 10 is powered via an external high voltage power line 18. Between power line 18 and each of bond pads 12, 14, and 16, is a first low drop off regulator (LDO) 20, a second LDO 22, and a third LDO 24, respectively.

Each of LDOs 20, 22, and 24 is also external to chip 10, and is configured to step down the high voltage from power line 18 to an operating power-supply voltage for the circuitry included in chip 10. More than one LDO is utilized because the voltage requirement for the circuitry associated with each of bond pads 12, 14, and 16 may be different from one another. For example, the circuitry associated with first bond pad 12 may be a digital circuit and have a lower operating voltage than an analog circuit associated with second bond pad 14.

External LDOs, however, occupy valuable space on a circuit board and/or produce design or assembly challenges relating to alignment, die size, or wire layout restrictions. Such design or assembly challenges also increase the overall system cost.

Thus, there is a need for an IC layout that provides embedded or internal LDOs. There is a further need for an IC having embedded LDOs with minimal change to its internal circuitry. There is still a further need for an IC architecture that provides flexibility in the position and number of internal power supply points.

SUMMARY

One embodiment of the present invention relates to a low drop-off regulator. The regulator includes an input coupled to a power ring included in an integrated circuit and an output coupled to an internal circuit included in the integrated circuit. The regulator is configured to modify a voltage provided at the power ring in accordance with an operating power requirement of the internal circuit. The regulator is included in the integrated circuit and within an inner side of the power ring.

Another embodiment of the present invention relates to an integrated circuit. The integrated circuit includes a power ring, a first low drop-off regulator, and a bond pad. The power ring is positioned approximately around an outer perimeter of the integrated circuit. The first low drop-off regulator is coupled to the power ring. The bond pad is adjacent to the first low drop-off regulator and coupled to the power ring. The bond pad and the first low drop-off regulator are positioned within an inner side of the power ring. Each of the bond pad and the first low drop-off regulator is configured to fit within a bond pad frame.

Still another embodiment of the present invention relates to a method for reducing circuit board space requirements. The method includes providing an integrated circuit having a power ring, and forming an embedded regulator adjacent an inner side of the power ring. The method further includes coupling an input of the embedded regulator to the power ring, and coupling the integrated circuit to the circuit board. The integrated circuit is powered via a high voltage power line coupled to the power ring. Forming the embedded regulator includes configuring the embedded regulator to fit within a bond pad frame.

Yet another embodiment of the present invention relates to an embedded voltage regulator. The regulator includes an input coupled to a voltage supply point included in an integrated circuit. The regulator further includes an output coupled to a circuit included in the integrated circuit. The embedded voltage regulator is included in the integrated circuit.

BRIEF DESCRIPTION OF THE DRAWINGS

The exemplary embodiments will become more fully understood from the following detailed description, taken in conjunction with the accompanying drawings, wherein like reference numerals denote like elements, in which.

As is conventional in the field of circuit representation, sizes of electrical components are not drawn to scale, and various components can be enlarged or reduced to improve drawing legibility. Component details have been abstracted in the Figures to exclude details such as position of components and certain precise connections between such components when such details are unnecessary to the invention.

DETAILED DESCRIPTION

Figure 1:
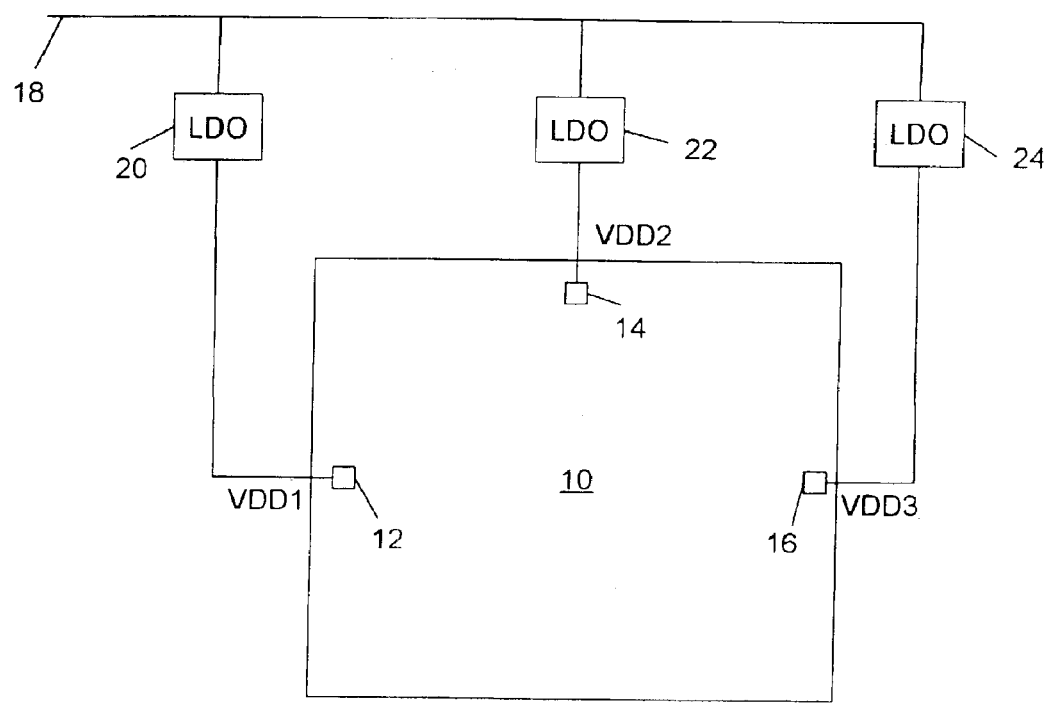
FIG. 1 is a top view of a semiconductor chip showing external LDOs connected thereto.
Figure 2:
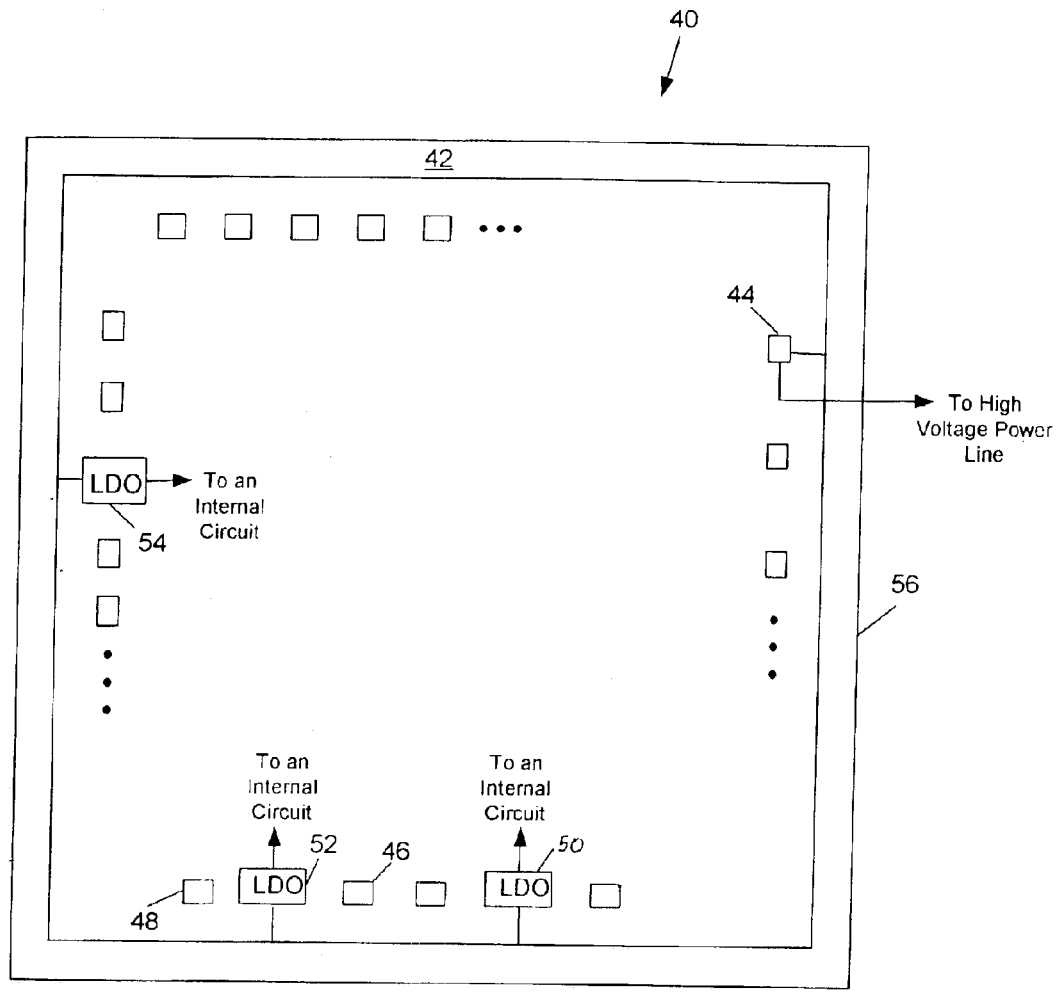
FIG. 2 is a top view of a semiconductor chip including embedded LDOs.

Referring to FIG. 2, there is shown a top view of a semiconductor chip 40. Chip 40 includes a power ring 42, a first bond pad 44, a second bond pad 46, a third bond pad 48, a first low drop off regulator (LDO) 50, a second LDO 52, and a third LDO 54. Chip 40 is configured to connect to a motherboard, circuit board, etc. via a package die.

Power ring 42, also referred to as a high voltage power ring, encircles bond pads 44, 46, and 48 and LDOs 50, 52, and 54. Power ring 42 abuts or is proximate an edge 56 of chip 40. A plurality of bond pads (also referred to as bonding pads), such as bond pads 44, 46, and 48, are distributed and located within the inner side of power ring 42. The grouping, number, and/or position of the bond pads are determined based on, among others, general design constraints and package type.

A plurality of LDOs, such as LDOs 50, 52, and 54, are also distributed and located within the inner side of power ring 42. The number of LDOs is determined by the number of circuits included in chip 40 (hereinafter referred to as internal circuits) and the different operating power requirements of such internal circuits. Three LDOs are included in chip 40 (FIG. 2) for illustrative purposes only.

It should be understood that the bond pads and LDOs included on chip 40 are not to scale. Although the LDOs are shown visible from the top view, the LDOs may alternatively be fabricated within the lower layers of chip 40 such that the LDOs are not visible from the top. Power ring 42 and bond pads 44, 46, and 48 may be comprised of a conductive material, such as a metal or polysilicon, provided on chip 40 by conventional semiconductor fabrication process(es).

In one embodiment, chip 40 comprises a system on chip (SoC) and includes internal circuits having one or more different operating voltage requirements. Internal circuits can include, but are not limited to, processors, memory, controllers, computers, clocks, buses, peripherals, microprocessors, microcontrollers, logic circuits, I/O circuits, etc.

First bond pad 44 connects to power ring 42. A high voltage power line connects to first bond pad 44. Alternatively, the high voltage power line may connect directly to power ring 42 or via a dedicated high voltage input connection provided on chip 40. The remaining bond pads in chip 40, including second and third bond pads 46, and 48, provide I/O points for chip 40.

The input of each of LDOs 50, 52, and 54 connects to power ring 42. The output of each of LDOs 50, 52, and 54 connects to an internal circuit. Depending on the operating voltage of each of the internal circuits, LDOs 50, 52, and 54 are configured to appropriately step down the high voltage from power ring 42. LDOs 50, 52, and 564 serve as optimal power supplies for its respective internal circuits.

The layout of each of LDOs 50, 52, and 54 is configured to fit into a bonding pad frame. Accordingly, the number and position of LDOs within chip 40 are flexible with minimal change to internal circuitry layout. LDOs 50, 52, and 54 can be located wherever a bond pad can be located within chip 40.

In this manner, power supplies for various circuitry of a semiconductor chip can be provided on-board with minimal loss to chip, package die, or board active area. Providing embedded LDOs reduces lengthy wire connections or additional pins, which is beneficial for reducing system cost, layout design considerations, reducing sources of circuit connection failures, and/or reducing circuit noise.

From the foregoing, it will be appreciated that specific embodiments of the invention have been described herein for purposes of illustration, but that various modifications may be made without deviating from the spirit and scope of the invention. For example, although embedded LDOs are discussed herein, other circuits, power supplies, voltage drop-off or step-up components, waveform or phase modifying components, etc. may be similarly embedded in the semiconductor chip. Accordingly, the invention is not limited except as by the appended claims.

We claim:

1. A low drop-off regulator comprising:
an input coupled to a power ring included in an integrated circuit; and
an output coupled to an internal circuit included in the integrated circuit,
wherein the low drop-off regulator is configured to modify a voltage provided at the power ring in accordance with an operating power requirement of the internal circuit, and the low drop-off regulator is included in the integrated circuit and within an inner side of the power ring.

2. The regulator of claim 1, wherein the low drop-off regulator is configured to fit within a bond pad frame.

3. The regulator of claim 1, wherein the integrated circuit is a system on chip (SoC).

4. A integrated circuit comprising:
a power ring positioned approximately around an outer perimeter of the integrated circuit;
a first low drop-off regulator coupled to the power ring; and
a bond pad adjacent to the first low drop-off regulator and coupled to the power ring, wherein the bond pad and the first low drop-off regulator are positioned within an inner side of the power ring, and each of the bond pad and the first low drop-off regulator is configured to fit within a bond pad frame.

5. The integrated circuit of claim 4, further comprising a first circuit coupled to the first low drop-off regulator, an operating power requirement of the first circuit being less than a voltage provided at the power ring.

6. The integrated circuit of claim 5, further comprising a second low drop-off regulator configured to couple with the power ring and located within an inner side of the power ring.

7. The integrated circuit of claim 6, further comprising a second circuit coupled to the second low drop-off regulator, the operating power requirement of the second circuit being less than the voltage provided at the power ring.

8. The integrated circuit of claim 7, wherein the operating power requirement of the first circuit and the second circuit are different from each other.

9. The integrated circuit of claim 5, wherein the second low drop-off regulator is configured to fit within the bond pad frame.

10. The integrated circuit of claim 4, wherein the integrated circuit is a system on chip (SoC).

11. A method for reducing circuit board space requirements, the method comprising:
providing an integrated circuit having a power ring;
forming an embedded regulator adjacent an inner side of the power ring;
coupling an input of the embedded regulator to the power ring; and
coupling the integrated circuit to the circuit board, wherein the integrated circuit is powered via a high voltage power line coupled to the power ring, and forming the embedded regulator includes configuring the embedded regulator to fit within a bond pad frame.

12. The method of claim 11, further comprising providing a bond pad adjacent to the embedded regulator, the bond pad configured to fit within the bond pad frame.

13. The method of claim 11, further comprising providing a circuit within the inner side of the power ring.

14. The method of claim 13, wherein forming the embedded regulator includes coupling an output of the embedded regulator to the circuit.

15. The method of claim 13, wherein an operating power requirement associated with the circuit is less than a power associated with the high voltage power line.

16. An embedded voltage regulator comprising:
an input coupled to a voltage supply point included in an integrated circuit; and
an output coupled to a circuit included in the integrated circuit, wherein the embedded voltage regulator is included in the integrated circuit.

17. The embedded voltage regulator of claim 16, wherein a voltage of the voltage supply point is different than an operating voltage of the circuit.

18. The embedded voltage regulator of claim 16, wherein the voltage supply point is a power ring and the voltage supply point encircles the embedded voltage regulator.

\* \* \* \* \*